(12) United States Patent
Uhlemann et al.

(10) Patent No.: US 9,731,370 B2
(45) Date of Patent: Aug. 15, 2017

(54) DIRECTLY COOLED SUBSTRATES FOR SEMICONDUCTOR MODULES AND CORRESPONDING MANUFACTURING METHODS

(71) Applicant: Infineon Technologies AG, Neubiberg (DE)

(72) Inventors: Andre Uhlemann, Dortmund (DE); Alexander Herbrandt, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 596 days.

(21) Appl. No.: 13/873,599

(22) Filed: Apr. 30, 2013

(65) Prior Publication Data

US 2014/0321063 A1 Oct. 30, 2014

(51) Int. Cl.
*H01L 23/367* (2006.01)
*H01L 23/00* (2006.01)
(Continued)

(52) U.S. Cl.
CPC .......... *B23K 9/042* (2013.01); *H01L 21/4871* (2013.01); *H01L 23/3677* (2013.01); *H01L 23/3735* (2013.01); *H01L 23/4334* (2013.01); *H01L 23/473* (2013.01); *B23K 2201/40* (2013.01); *H01L 24/29* (2013.01); *H01L 24/32* (2013.01); *H01L 24/33* (2013.01); *H01L 24/48* (2013.01); *H01L 24/73* (2013.01); *H01L 2224/29101* (2013.01); *H01L 2224/32225* (2013.01); *H01L 2224/48091* (2013.01); *H01L 2224/48227* (2013.01); *H01L 2224/48472* (2013.01); *H01L 2224/73265* (2013.01); *H01L 2224/8384* (2013.01); *H01L 2224/83801* (2013.01); *H01L 2924/00014* (2013.01); *H01L 2924/12042* (2013.01); *H01L 2924/1305* (2013.01); *H01L 2924/13055* (2013.01); *H01L 2924/13062* (2013.01);
(Continued)

(58) Field of Classification Search
CPC .................................................... H01L 23/3677
USPC ......................................... D13/179; 257/720
See application file for complete search history.

(56) References Cited

U.S. PATENT DOCUMENTS 5,157,588 A 10/1992 Kim et al.
5,824,569 A * 10/1998 Brooks ............... H01L 23/3107
257/E21.511
(Continued)

FOREIGN PATENT DOCUMENTS

CN 102208380 A 10/2011
JP 2012186288 A 9/2012

*Primary Examiner* — Robert Carpenter
(74) *Attorney, Agent, or Firm* — Murphy, Bilak & Homiller, PLLC

(57) ABSTRACT

A semiconductor module includes a substrate having a metallized first side and a metallized second side opposing the metallized first side. A semiconductor die is attached to the metallized first side of the substrate. A plurality of cooling structures are welded to the metallized second side of the substrate. Each of the cooling structures includes a plurality of distinct weld beads disposed in a stacked arrangement extending away from the substrate. The substrate can be electrically conductive or insulating. Corresponding methods of manufacturing such semiconductor modules and substrates with such welded cooling structures are also provided.

8 Claims, 8 Drawing Sheets

(51) Int. Cl.
*B23K 9/04* (2006.01)
*H01L 23/373* (2006.01)
*H01L 23/433* (2006.01)
*H01L 23/473* (2006.01)
*H01L 21/48* (2006.01)
*B23K 101/40* (2006.01)

(52) U.S. Cl.
CPC ............... *H01L 2924/13091* (2013.01); *H01L 2924/181* (2013.01); *H01L 2924/19105* (2013.01)

(56) References Cited

U.S. PATENT DOCUMENTS

| | | | |
|---|---|---|---|
| 6,043,985 A * | 3/2000 | Azdasht | H01L 23/367 |
| | | | 174/252 |
| 7,446,419 B1 * | 11/2008 | Lin | H01L 23/49805 |
| | | | 257/777 |
| 7,838,988 B1 * | 11/2010 | Gurrum | H01L 23/3171 |
| | | | 257/706 |
| 2004/0262774 A1 * | 12/2004 | Kang | H01L 21/563 |
| | | | 257/777 |
| 2012/0217628 A1 * | 8/2012 | Chou | H01L 23/3677 |
| | | | 257/692 |
| 2013/0062750 A1 | 3/2013 | Lenniger et al. | |
| 2013/0084679 A1 | 4/2013 | Stolze et al. | |
| 2013/0285234 A1 * | 10/2013 | Uhlemann | H01L 23/473 |
| | | | 257/712 |

* cited by examiner

DIRECTLY COOLED SUBSTRATES FOR SEMICONDUCTOR MODULES AND CORRESPONDING MANUFACTURING METHODS

TECHNICAL FIELD

The instant application relates to semiconductor modules, and more particularly to directly cooled substrates for semiconductor modules and methods of manufacturing such substrates and modules.

BACKGROUND

Heat dissipation is an important consideration in the design of power electronics and must be controlled carefully. To protect semiconductor devices against overheating, the cooling system of a power module should be very efficient. The cooling approach is typically based on the type of power module. For example, power modules can be cooled directly or indirectly. Furthermore, modules may or may not have a base plate where the base plate can be flat or structured. Conventional power module base plates are normally made of copper because of the excellent heat conductivity. Other materials like AlSiC, aluminum or clad materials are suitable substitutes with the advantage of a lower cost. Power modules without a base plate are less expensive, but with reduced thermal performance as compared to modules that use a base plate.

Power modules with and without a base plate can be cooled indirectly by an air or fluid based cooler. Typically the heat generated in the semiconductor dies (chips) flows through a ceramic substrate with metallized sides such as a DCB (direct-copper-bonded), the different solder layers (chip-soldering, system soldering, etc.) and the base plate. The thermal contact for heat conduction is realized by a thermal grease between the base plate (or DCB in the case of no base plate) and the cooler. Cooling semiconductor dies in this way is less than optimal as the thermal grease has a low heat conductivity of about 1 W/mK.

Directly cooled power modules with structured base plates provide more efficient cooling of power devices. Such base plates have pin or fin cooling structures on the bottom side of the base plate in direct contact with a cooling liquid (e.g. water, or a water glycol mixture) so that high heat transfer coefficients are achieved. Different technologies for structured base plate production are available such as metal-injection-molding process (MIM) or forging technology, which tend to have high production and material costs.

SUMMARY

According to an embodiment of a semiconductor module support member, the support member comprises a substrate having a metallized side and a plurality of cooling structures welded to the metallized side of the substrate. Each of the cooling structures comprises a plurality of distinct weld beads disposed in a stacked arrangement extending away from the substrate.

According to an embodiment of a semiconductor module, the semiconductor module comprises a substrate having a metallized first side and a metallized second side opposing the metallized first side. A semiconductor die is attached to the metallized first side of the substrate. A plurality of cooling structures are welded to the metallized second side of the substrate. Each of the cooling structures comprises a plurality of distinct weld beads disposed in a stacked arrangement extending away from the substrate.

According to an embodiment of forming cooling structures for a semiconductor module, the method comprises: providing a substrate having a metallized side; and welding a plurality of cooling structures to the metallized side of the substrate, each of the cooling structures comprising a plurality of distinct weld beads disposed in a stacked arrangement extending away from the substrate.

According to an embodiment of a method of manufacturing a semiconductor module, the method comprises: providing a substrate having a metallized first side and a metallized second side opposing the metallized first side; attaching a semiconductor die to the metallized first side of the substrate; and welding a plurality of cooling structures to the metallized second side of the substrate, each of the cooling structures comprising a plurality of distinct weld beads disposed in a stacked arrangement extending away from the substrate.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

According to embodiments described herein, cooling structures are added to the metallized side of a support member for semiconductor modules by a multi-stage welding process. The cooling structures are built up in a step-by-step manner via an arc welding or other type of welding process applied several times on a substrate. In a first stage of the welding process, a weld bead is formed on a metallized side of the substrate. In each successive stage, an additional weld bead is added to form a stacked arrangement of distinct weld beads which extends away from the substrate. Each stacked arrangement of weld beads forms a cooling structure. The resulting support member with directly welded cooling structures provides a cost-effective solution for use in semiconductor modules to more efficiently transfer heat away from semiconductor dies included in the modules.

Figure 1:
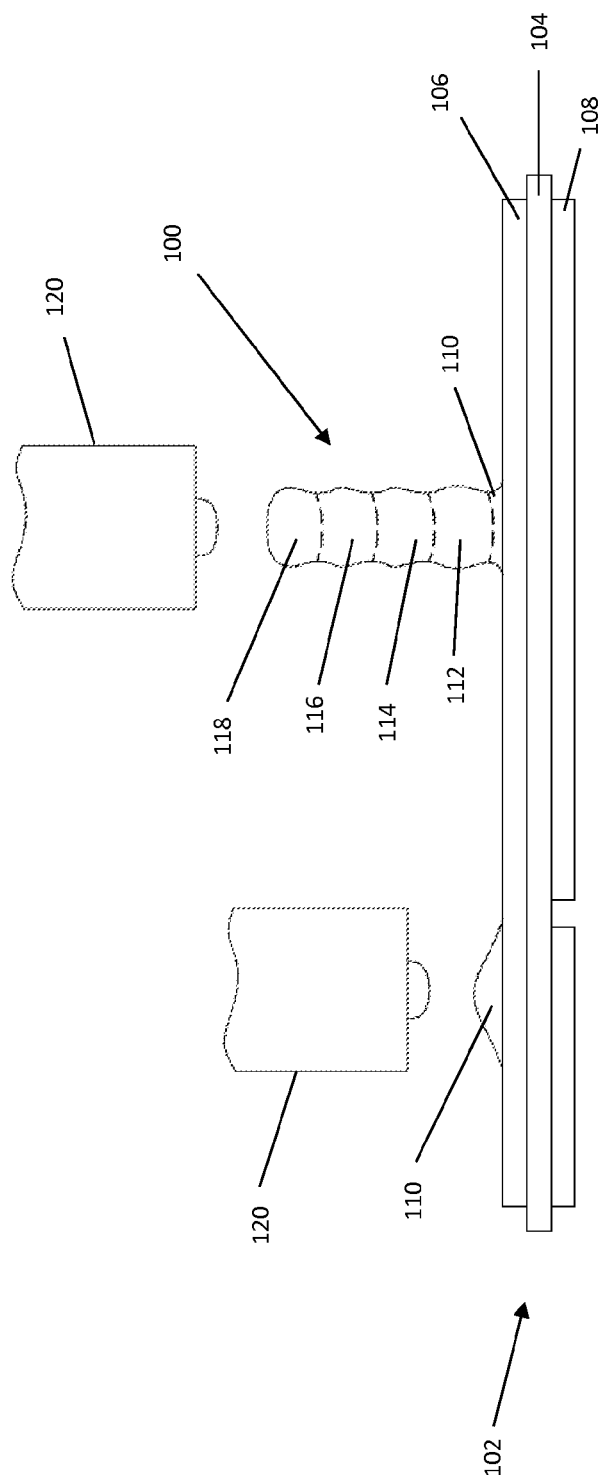
FIG. 1 illustrates a side perspective view of an embodiment of a support member for a semiconductor module during formation of cooling structures on the support member.

FIG. 1 illustrates an embodiment of forming cooling structures 100 on a support member 102 for a semiconductor module. The support member 102 can be any type of substrate with a metallized side for use in a semiconductor module. For example, the substrate 102 can be a metal region of a lead frame, TFC (thick film copper), a metal clip, etc. Alternatively, the substrate 102 can be a metal block bonded to the backside of a semiconductor substrate such as a silicon substrate or compound semiconductor substrate.

The substrate 102 shown in FIG. 1 comprises an isolation material 104 with opposing metallized sides 106, 108. The metallized first side 106 of the substrate 102 can comprise the same or different material than the metallized second side 108 of the substrate 102. For example, the substrate 102 can be a standard DCB (direct copper bonded), DAB (direct aluminum bonded), AMB (active metal brazed) or IMS (insulated metal substrate) substrate. A standard DCB substrate includes copper surfaces applied to the top and bottom areas of an isolation material such as $Al_2O_3$ ceramic material. A standard DAB substrate includes aluminum surfaces applied to the top and bottom areas of a ceramic material. A standard AMB substrate includes metal foils brazed to opposing sides of an isolation material such as an AlN ceramic material. A standard IMS substrate includes an isolation material such as a polymer directly connected to a module base plate. In each case, a plurality of cooling structures 100 are directly welded to a metallized side 106 of the substrate 102.

FIG. 1 shows two cooling structures 100 at different stages of the welding process. Upon completion of the welding process, each of the cooling structures 100 comprises a plurality of distinct weld beads 110, 112, 114, 116, 118 disposed in a stacked arrangement extending away from the substrate 102. The left-hand side of FIG. 1 shows a first welding stage for forming a cooling structure 100, which includes forming a first distinct weld bead 110 directly welded to the metallized side 106 of the substrate 102. In one embodiment, the first weld bead 110 is formed by arc welding and comprises the same material as the metallized side 106 of the substrate 102 to which the first weld bead 110 is bonded. Arc welding is a process in which a power supply is used to create an electric arc between an electrode 120 and the metallized side 106 of the substrate 102 to melt the metals at the welding point. A second weld bead 112 is formed on the first weld bead 110 after the first molten pool sufficiently solidifies to form the first weld bead 110. This way, distinct weld beads 110, 112, 114, 116, 118 can be stacked one on the other to form cooling structures 100 which extend away from the substrate 102. The arc welding process can use either direct current (DC) or alternating current (AC), and consumable or non-consumable electrodes 120. The welding region can be protected by some type of shielding gas, vapor, or slag which is not shown in FIG. 1 for ease of illustration. The arc welding process can be manual, semi-automatic, or fully automated. No mechanical treatment of the substrate 102 takes place with arc welding since arc welding is based on electric current, eliminating cracks of the substrate 102 or other irreversible damage. Other types of welding processes such as laser welding can be employed to form weld beads 110, 112, 114, 116, 118 directly welded to the metallized side 106 of the substrate 102.

In a second stage of the welding process, a third distinct weld bead 114 is formed on each of the second weld beads 112 after the second weld beads 112 solidify. Additional successive welding stage(s) can be carried out to form one or more additional distinct weld beads 116, 118 on each stack of preexisting weld beads after the previously formed weld beads solidify. In general, the weld beads 110, 112, 114, 116, 118 in each stacked arrangement are formed in successive stages by arc welding or other suitable welding process with a solidification period between each welding stage that allows the weld beads formed in the preceding stage to solidify before the weld beads in the next stage are formed. The right-hand side of FIG. 1 shows a cooling structure 100 during a fifth welding stage, which includes forming a fifth distinct weld bead 118 on the fourth weld bead 116 in the stacked arrangement. This cooling structure 100 has five distinct weld beads 110, 112, 114, 116, 118 stacked one on the other and directly welded to the metallized side 106 of the substrate 102. The weld beads 110, 112, 114, 116, 118 can be blobs or lines of weld metal. As such, the cooling structures 100 can have a generally columnar shape in the case of blob-shaped weld beads or a generally fin-type shape in the case of line-shape weld beads. At least some columnar cooling structures 100 can have different diameters and lengths.

In each case, the most recently formed weld bead is permitted to solidify before the next weld bead in the stack is formed so that the cooling structures 100 are formed of stacked arrangements of distinct weld beads 110, 112, 114, 116, 118. In an arc welding embodiment, a weld interface or joint is present between adjacent ones of the weld beads 110, 112, 114, 116, 118 in the same stacked arrangement as indicated by the dashed lines shown in the cooling structure 100 illustrated in the right-hand side of FIG. 1. The cooling structures 100 can be formed in serial i.e. each stacked arrangement of weld beads 110, 112, 114, 116, 118 is formed one at a time. Alternatively, two or more cooling structures 100 can be formed in parallel i.e. two or more stacked arrangements of weld beads 110, 112, 114, 116, 118 can be formed at the same time. The number of cooling structures 100 formed in parallel depends on the current handling capability of the substrate 102. The greater the current handling capability of the substrate 102, the more cooling structures 100 that can be formed in parallel. In general, the cooling structures 100 are made of a material characterized by high heat conductivity and that fits optimally to the metallized side 106 of the substrate 102 so that corrosion is avoided. For example, aluminum can be used for the cooling structures 100 and for the substrate metallization 106 (e.g. DAB and AMB substrates). Copper instead can be used for the cooling structures 100 as well as for the substrate metallization 106. According to this embodiment, an additional process step such as nickel or chrome plating can be performed to protect the cooling structures 100 against corrosion. One side 106 of the substrate 102 can comprise a different metal than the opposing side 108.

Figure 2:
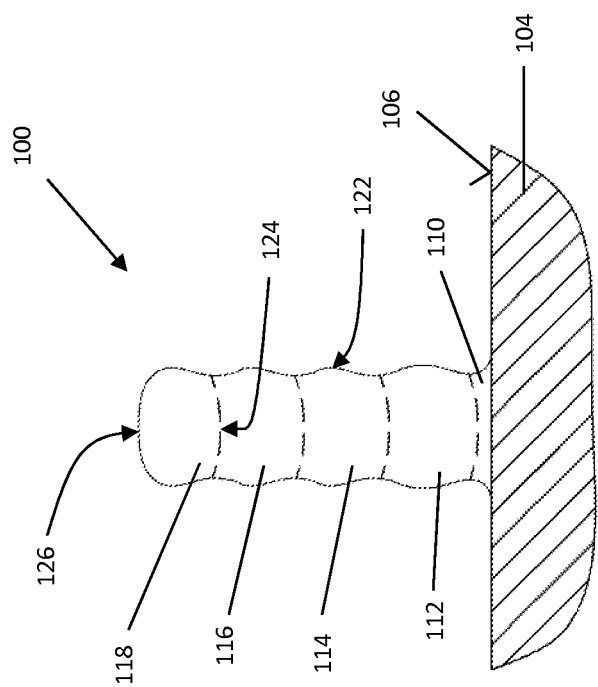
FIG. 2 illustrates a cross-sectional view of an embodiment of a cooling structure bonded to a metallized side of a semiconductor module support member.

FIG. 2 illustrates a cross-sectional view of a cooling structure 100 directly bonded to the metallized side 106 of a substrate 102. The cooling structure 100 is a stacked arrangement of distinct weld beads 110, 112, 114, 116, 118. The substrate 102 can be a metal region of a lead frame, TFC (thick film copper), metal clip, metal block bonded to the backside of a semiconductor substrate, insulation material with one or more metallized sides, etc. as previously described herein. The stacked arrangement of weld beads 110, 112, 114, 116, 118 extends away from the substrate 102 to form the cooling structure 100. At least some of the weld beads 110, 112, 114, 116, 118 can have a curved exterior surface 122 owing to the welding process. Depending on the controllability of the welding process, one or more of the weld beads 110, 112, 114, 116, 118 can be non-uniformly shaped with respect to the other weld beads in the same cooling structure 100. For example, some weld beads can have a different diameter due to process fluctuations (e.g. 0.1 to 0.3 mm compared to other ones of the weld beads in the same stacked arrangement. Factors that control uniformity of weld beads 110, 112, 114, 116, 118 formed by arc welding include arc welding current, electrode material, substrate surface quality, substrate material, process time, electrode-to-substrate spacing, etc. The weld bead 118 disposed furthest from the substrate 102 has a proximal end 124 welded to the weld bead 116 next furthest from the substrate 102, and a rounded distal end 126. The metallized side 106 of the substrate 102 and the weld beads 110, 112, 114, 116, 118 can comprise the same material e.g. aluminum (including aluminum alloys), copper, etc. In general, the cooling structures 100 are made of metal (e.g. Al, Cu) and bonded to the metallized (e.g. Al, Cu) side 106 of the substrate 102.

Figure 3:
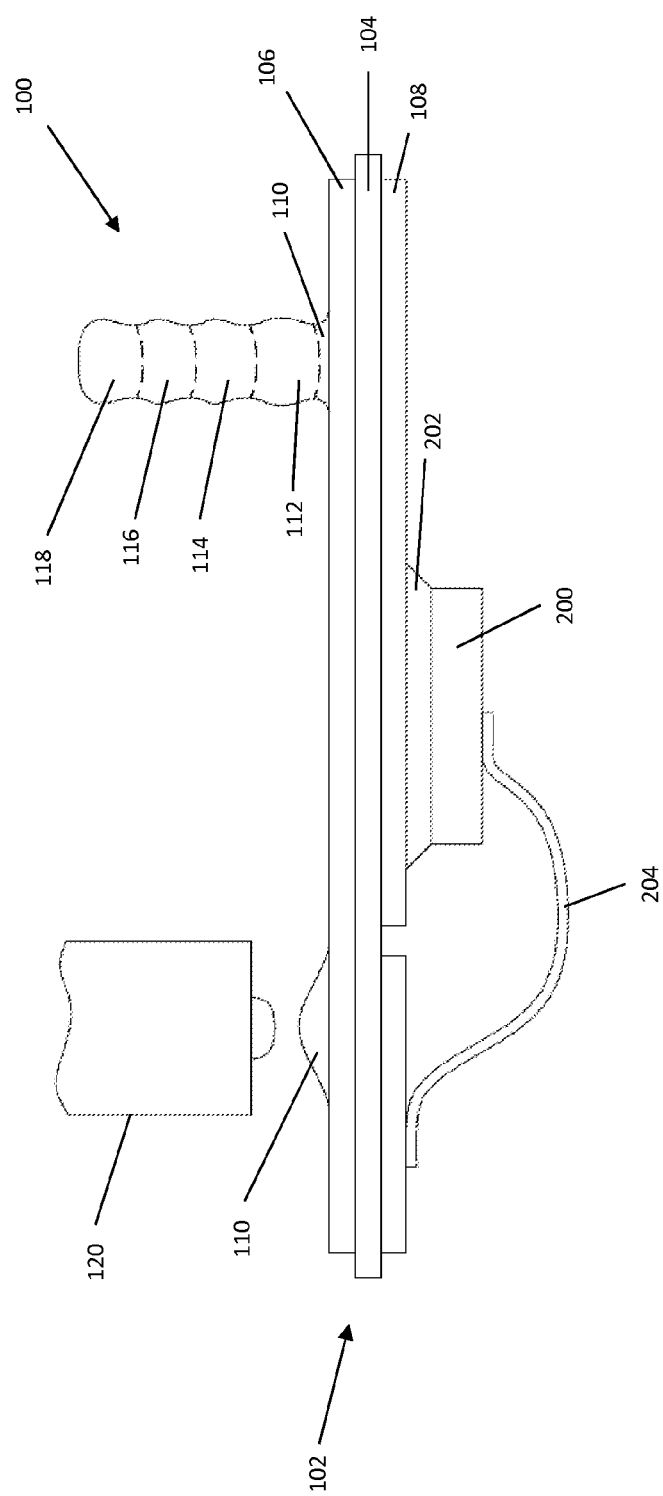
FIG. 3 illustrates a side perspective view of another embodiment of a support member for a semiconductor module during formation of cooling structures on the support member.

FIG. 3 illustrates an embodiment of part of a semiconductor module with directly bonded cooling structures 100 during the welding process. The module includes a substrate 102 comprising an isolation material 106 having opposing metallized sides 106, 108, a semiconductor die 200 attached to one metallized 108 side of the substrate 102 e.g. by a solder or sintered die attach layer 202, and a plurality of cooling structures 100 welded to the opposing metallized side 106 of the substrate 102. Each of the cooling structures 100 comprises a plurality of distinct weld beads 110, 112, 114, 116, 118 disposed in a stacked arrangement extending away from the substrate 102 as previously described herein. The cooling structures 100 can have the same or different number of distinct weld beads 110, 112, 114, 116, 118. An additional base plate is not needed for cooling purposes. Instead, the cooling structures 100 are directly bonded to a metallized side 106 of the substrate 102. The semiconductor die 200 is attached at the opposing metallized side 108. This side 108 of the substrate 102 can be patterned for providing electrical connections to the die 200. One or more of these connections can be completed by a bonding wire 204, ribbon, clip, etc. The cooling structures 100 are bonded to the substrate 102 as part of or prior to the die attach process according to this embodiment.

Figure 4:
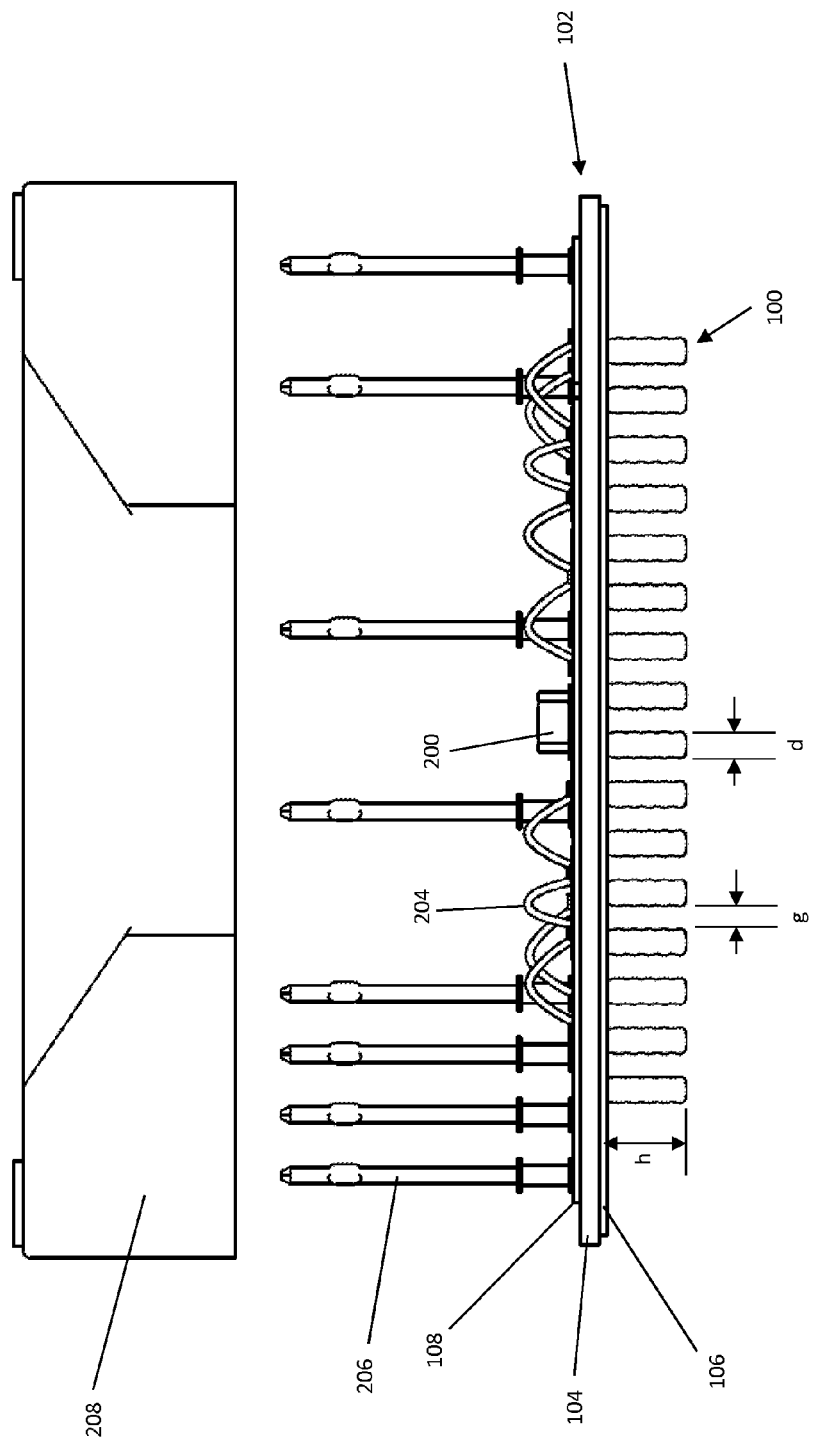
FIG. 4 illustrates a side perspective view of an embodiment of attaching a lid to a semiconductor module having a support member with cooling structures.

FIG. 4 illustrates the semiconductor module of FIG. 3 after the semiconductor dies 200, bonding wires 204 and electrical contact pins 206 for making external electrical connections to the module are formed, and prior to a package lid 208 being attached to the module. According to this embodiment, the cooling structures 100 are already bonded to the substrate 102 when the package lid 208 is attached to the module. The gap (g) between the cooling structures 100 can range from 1 mm to 4 mm. A smaller or larger spacing can be realized. The cooling structure spacing can be uniform or variable. The length (h) of the cooling structures 100 can range e.g. from 0.5 cm to 2 cm. Shorter or longer cooling structures 100 are also possible. The diameter (d) of the cooling structures 100 can range e.g. from 0.5 mm to 1.8 cm, or be smaller or larger.

Figure 5:
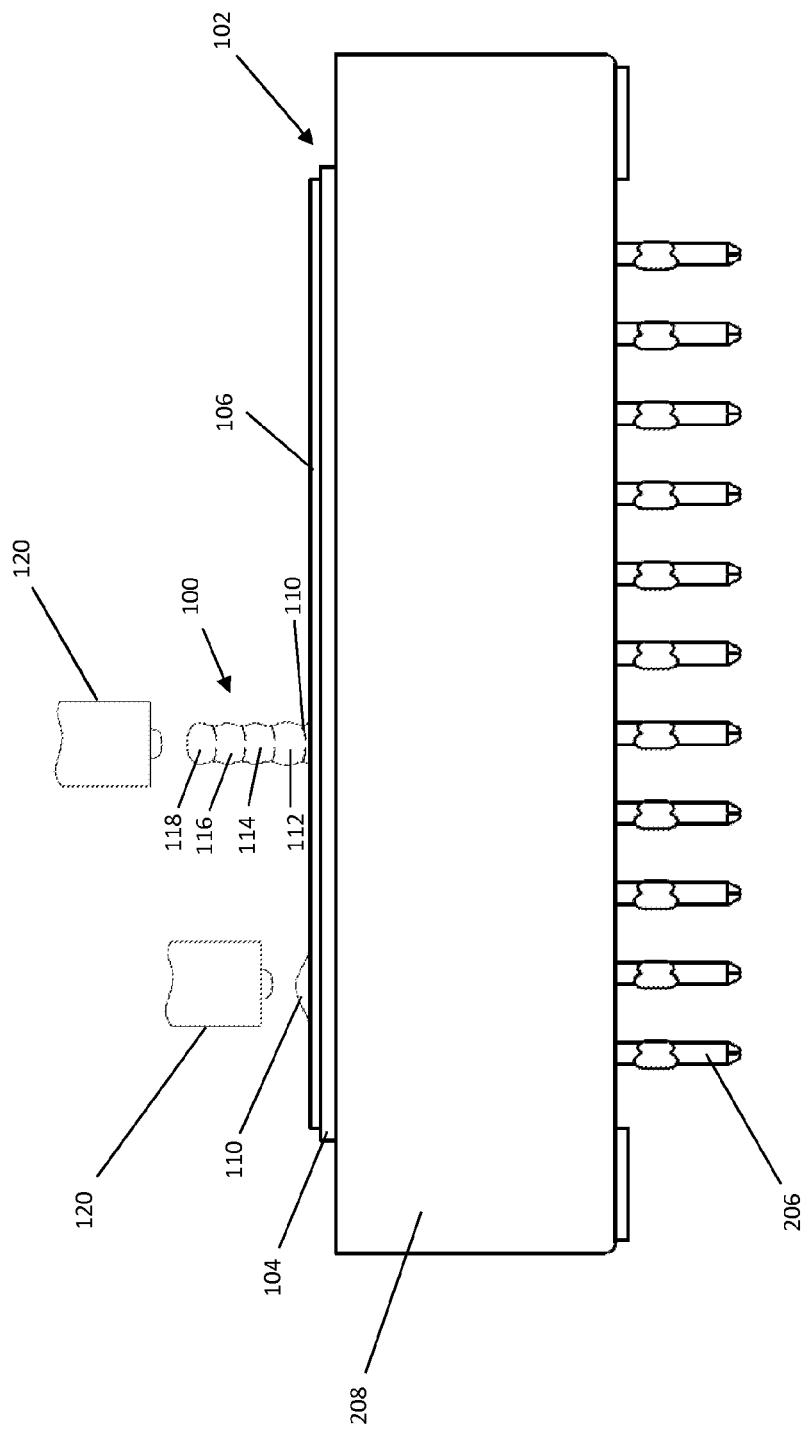
FIG. 5 illustrates a side perspective view of an embodiment of bonding cooling structures to an exposed side of a support member included in a semiconductor module having a lid.

FIG. 5 illustrates another embodiment of a semiconductor module similar to the embodiment shown in FIG. 4, however, the cooling structures 100 are bonded to the metallized side 106 of the substrate 102 which remains exposed after the package lid 208 is attached to the module. The weld bead formation embodiments previously described herein can be used to directly bond the cooling structures 100 to the exposed metallized side 106 of the substrate 102 after attachment of the package lid 208.

Figure 6:
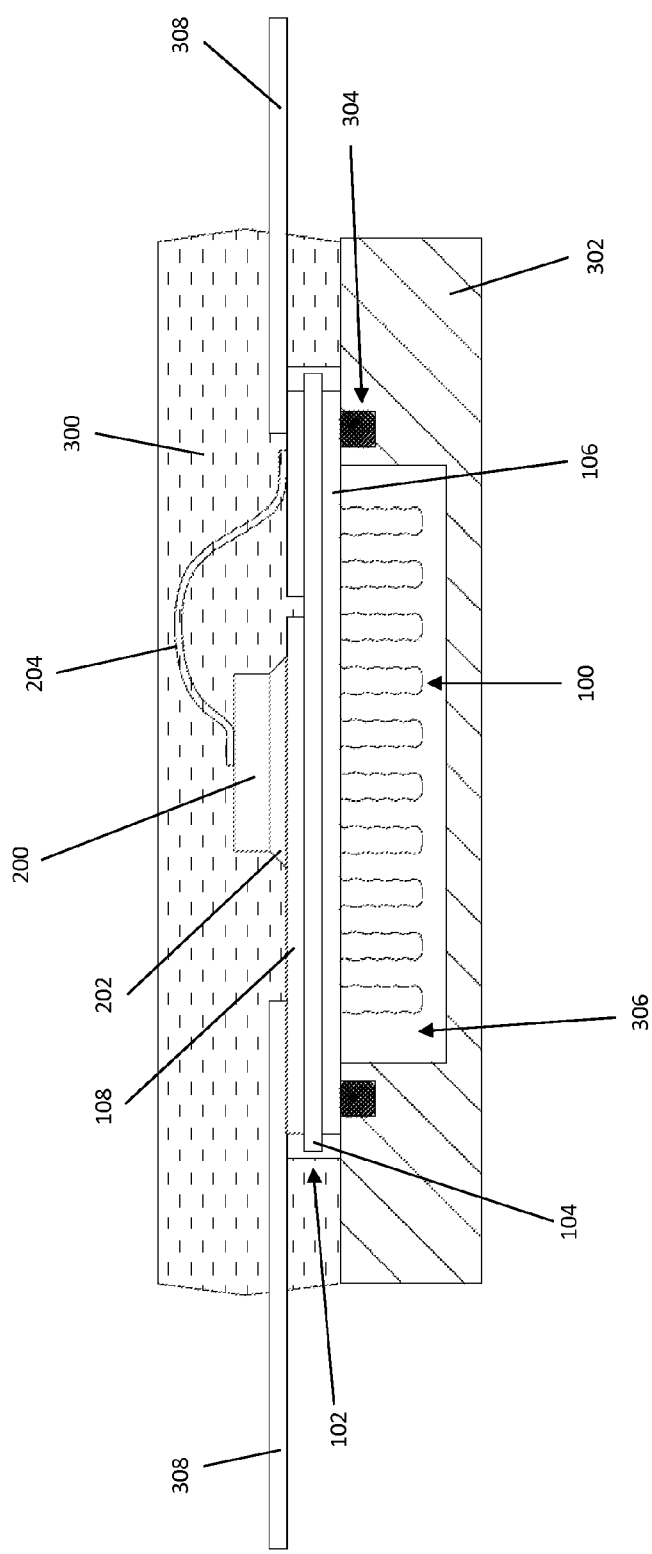
FIG. 6 illustrates a cross-sectional view of an embodiment of a semiconductor module with directly bonded cooling structures which extend into a recessed formed in a cooler attached to the module.

FIG. 6 illustrates a cross-sectional view of the semiconductor module of FIG. 3 after the cooling structures 100 are bonded to the substrate 102, and the semiconductor die 200 and the substrate 102 are encapsulated with a mold compound 300 such as an epoxy at the side 108 of the substrate 102 without the die 200. A cooler 302 is attached to a periphery of the metallized side 106 of the substrate 102 with the cooling structures 100 e.g. by screws or other fasteners 304. The periphery of the substrate 102 to which the cooler 302 is attached is free of the cooling structures 100. The cooling structures 100 extend away from the substrate 102 into a recessed region 306 of the cooler 302. The recessed region 306 can be filled with a liquid. The module can have external leads 308 which protrude from the mold compound 300 and provide points of external electrical connection for the encapsulated module.

Figure 7A:
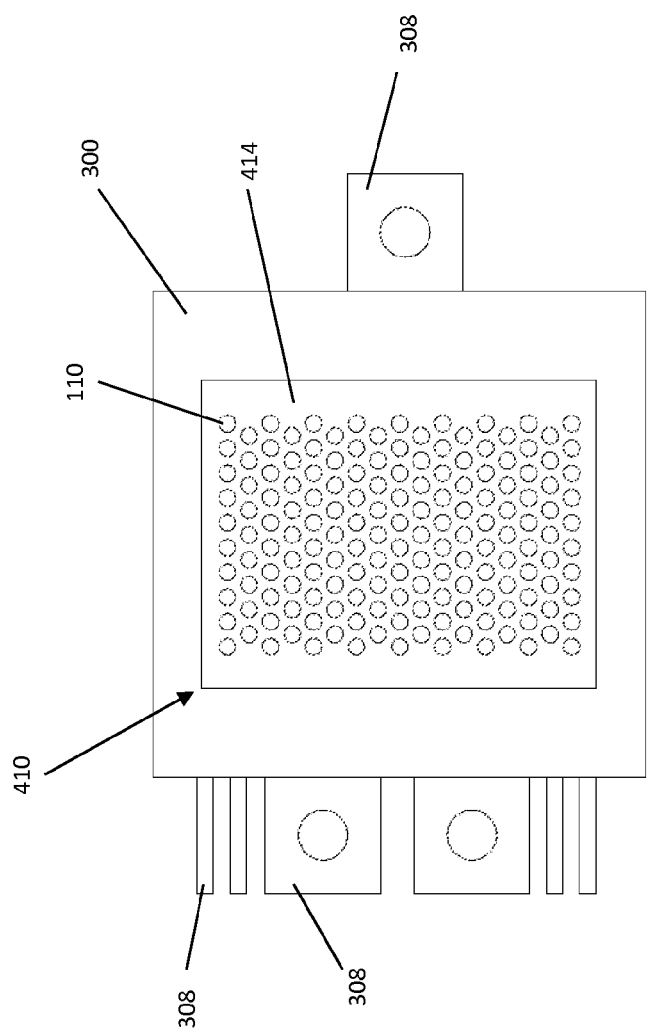
FIG. 7A illustrates a top down plan view of a semiconductor module according to yet another embodiment.
Figure 7B:
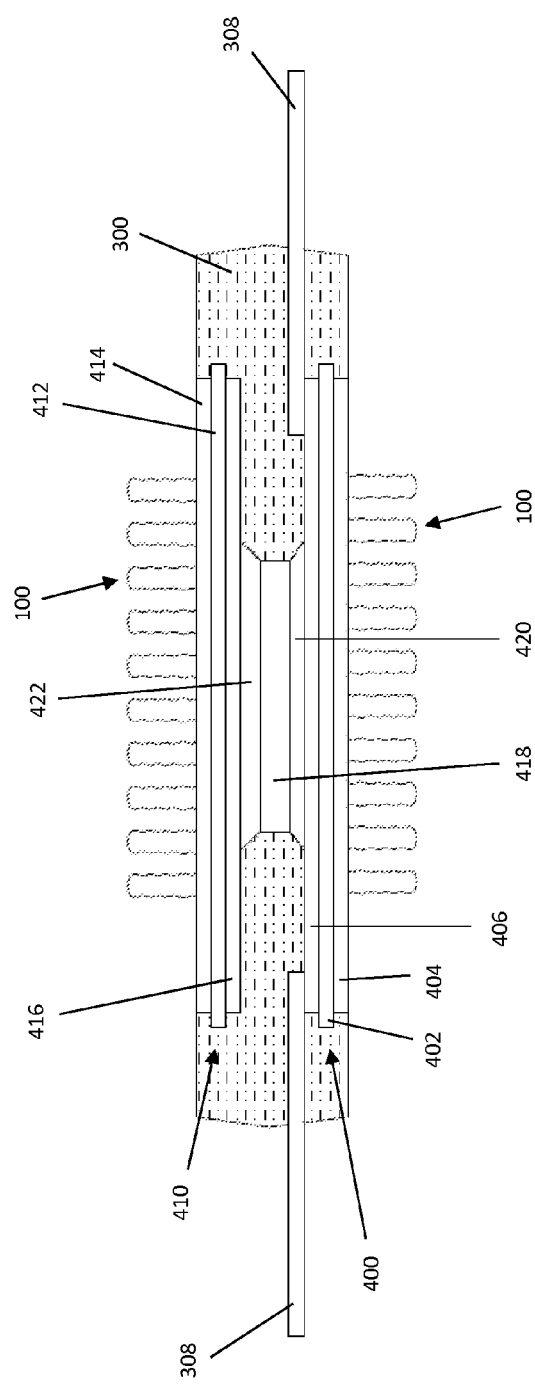
FIG. 7B illustrates a cross-sectional view of the module in FIG. 7A.

FIGS. 7A and 7B illustrate respective plan and cross-sectional views of a semiconductor module according to yet another embodiment. The power module has two thermal interfaces at opposing sides of the module for use in double-sides cooling applications. Each thermal interface is realized by a substrate 400, 410 comprising an isolation material 402, 412 such as a ceramic material and opposing metallized sides 404/406, 414/416 on the isolation material 402, 412. For such a double-sided cooling application, dies 418 included in the module have top side and bottom side metallization (not shown for ease of illustration) used for chip-soldering or sintering to the respective substrates 400, 410 via corresponding solder or sintered die attach layers 420, 422. The dies 418 are connected to both substrates 400, 410 by the die attach layers 420, 422. Terminals for the load current and gate signal are connected to the bottom or top substrate 400, 410 via respective leads 308. Similar to the module embodiment with the mold compound 300 as shown in FIG. 6, the remaining space between the substrates 400, 410 can be filled with a mold compound 300 to stabilize the configuration and fix the position of each die 418 inside the module. The upper substrate 410 embedded in the mold compound 300 is spaced apart from the semiconductor die 418 by part of the mold compound 300.

Module cooling can be further enhanced by providing the cooling structures 100 welded to the exposed metallized side 404, 414 of one or both substrates 400, 410 as shown in FIG. 7B. Each of the cooling structures 100 comprises a plurality of distinct weld beads disposed in a stacked arrangement extending away from the exposed metallized sides 404, 414 of the respective substrates 400, 410 as previously described herein. Both substrates 400, 410 can be processed at the same time if a higher level of automation is available.

The cooling structure welding processes described herein can be carried out within or after the process-chain for the power module. Therefore is not necessary to integrate an additional process step for cooling structures within the module process chain. The cooling structures offer a high heat transfer coefficient and a low thermal resistance comparable with directly cooled base plate systems. If aluminum is used for the cooling structures as well as for the substrate metallization, corrosion can be prevented. Power modules based on the substrates described herein with cooling structures eliminate a base plate and corresponding system soldering. Thus, production and material costs are reduced. In addition, a significant weight reduction is realized by eliminating the base plate.

Different concepts of power modules with directly cooled substrates as described herein are contemplated. For example, semiconductor modules for half-bridge, full-bridge or a 3-phase application can be realized with the cooling structures described herein. For power module production, power devices such as diodes, IGBTs (insulated gate bipolar transistors), JFETs (junction filed effect transistors) and/or power MOSFETs (metal oxide semiconductor field effect transistors) can be soldered or sintered to the top side of a ceramic substrate structured by etching in a defined way. For the electrical connections, bond wires and terminals can be provided for the control port and load current connections. After the die soldering and bonding steps, a plastic housing can be bolted or glued together with the substrate e.g. as shown in FIGS. 4 and 5. In the last process step a mold compound can be injected into the housing for electrical isolation and for higher mechanical stability e.g. as shown in FIGS. 6 and 7. This is one possible way to build a semiconductor module, however, other standard assembly and joining technologies can be employed to realize a power module with directly bonded cooling structures as described herein. For example, another possible type of power module is based on a ceramic substrate and a mold compound. The substrate with dies, bond wires and connections for +/− DC can be covered with a mold compound similar to SMD (surface-mounted-device) e.g. as shown in FIG. 5. The mold compound stabilizes the ceramic substrate mechanically and ensures electrical insulation. The cooling structure welding process can be applied before or after the molding process e.g. as shown in FIG. 6.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming cooling structures for a semiconductor module, the method comprising:
    providing a substrate having a metallized side;
    welding a plurality of cooling structures to the metallized side of the substrate, each of the cooling structures comprising a plurality of distinct weld beads disposed in a stacked arrangement extending away from the substrate,
    wherein a previously formed weld bead sufficiently solidifies before a successive weld bead is formed thereon,
    wherein a first end of the stacked arrangement is attached to the metallized side whereas a second end of the stacked arrangement is free standing; and
    attaching a cooler to a periphery of the metallized side of the substrate, the periphery being free of the cooling structures, wherein the cooling structures extend away from the substrate into a recessed region of the cooler.

2. The method of claim 1, wherein welding the plurality of cooling structures to the metallized side of the substrate comprises:
    forming a plurality of first distinct weld beads on the metallized side of the substrate;
    forming a second distinct weld bead on each of the first weld beads after the first weld beads solidify; and
    forming a third distinct weld bead on each of the second weld beads after the second weld beads solidify.

3. The method of claim 2, wherein the first weld beads, the second weld beads and the third weld beads are formed in successive stages by arc welding with a weld bead solidification period between each stage that allows the weld beads formed in the preceding stage to solidify before the weld beads in the next stage are formed.

4. A method of manufacturing a semiconductor module, the method comprising:
    providing a substrate having a metallized first side and a metallized second side opposing the metallized first side;
    attaching a semiconductor die to the metallized first side of the substrate; and
    welding a plurality of cooling structures to the metallized second side of the substrate, each of the cooling structures comprising a plurality of distinct weld beads disposed in a stacked arrangement extending away from the substrate,
    wherein a previously formed weld bead sufficiently solidifies before a successive weld bead is formed thereon,
    wherein a first end of the stacked arrangement is attached to the metallized second side whereas a second end of the stacked arrangement is free standing,
    wherein the plurality of cooling structures is electrically isolated from the semiconductor die by the substrate.

5. The method of claim 4, wherein welding the plurality of cooling structures to the metallized second side of the substrate comprises:
    forming a plurality of first distinct weld beads on the metallized second side of the substrate;
    forming a second distinct weld bead on each of the first weld beads after the first weld beads solidify; and
    forming a third distinct weld bead on each of the second weld beads after the second weld beads solidify.

6. The method of claim 4, wherein the first weld beads, the second weld beads and the third weld beads are formed in successive stages by arc welding with a weld bead solidification period between each stage that allows the weld beads formed in the preceding stage to solidify before the weld beads in the next stage are formed.

7. The method of claim 4, further comprising attaching a cooler to a periphery of the metallized second side of the substrate, the periphery being free of the cooling structures, wherein the cooling structures extend away from the substrate into a recessed region of the cooler.

8. The method of claim 4, further comprising:
    encapsulating the semiconductor die and the substrate with a mold compound;
    embedding an additional substrate in the mold compound above the metallized first side of the substrate and spaced apart from the semiconductor die by part of the mold compound, the additional substrate having a first side facing the semiconductor die and an opposing second side; and welding a plurality of cooling structures to the second side of the additional substrate, each of the cooling structures comprising a plurality of distinct weld beads disposed in a stacked arrangement extending away from the additional substrate, wherein the cooling structures welded to the second side of each substrate protrude out of the mold compound.

* * * * *